United States Patent [19]
Hashimoto et al.

[11] Patent Number: 5,369,046
[45] Date of Patent: Nov. 29, 1994

[54] METHOD FOR FORMING A GATE ARRAY BASE CELL

[75] Inventors: Masahashi Hashimoto, Garland; Shivaling S. Mahant-Shetti, Richardson, both of Tex.

[73] Assignee: Texas Instruments Incorporated, Dallas, Tex.

[21] Appl. No.: 968,213

[22] Filed: Oct. 29, 1992

Related U.S. Application Data

[63] Continuation of Ser. No. 682,803, Apr. 8, 1991, abandoned.

[51] Int. Cl.⁵ .................. H01C 21/265; H01L 21/28
[52] U.S. Cl. ........................ 437/48; 437/51; 437/52; 437/186
[58] Field of Search ............... 257/202, 203, 204, 211; 437/48, 50–52, 57, 186

[56] References Cited

U.S. PATENT DOCUMENTS

| | | | |
|---|---|---|---|
| 4,554,729 | 11/1985 | Tanimura et al. | 437/48 |
| 4,561,170 | 12/1985 | Doering et al. | 437/48 |
| 5,095,356 | 3/1992 | Ando et al. | 357/45 |
| 5,136,356 | 8/1992 | Sakuda et al. | 357/45 |
| 5,187,555 | 2/1993 | Kuroda et al. | 257/202 |
| 5,217,915 | 6/1993 | Hashimoto et al. | 437/48 |
| 5,275,962 | 1/1994 | Hashimoto | 437/48 |

FOREIGN PATENT DOCUMENTS

| | | | |
|---|---|---|---|
| 55-156370 | 12/1980 | Japan | 437/52 |
| 59-54260 | 3/1984 | Japan | 437/48 |
| 1-144655 | 6/1989 | Japan | 437/52 |
| 2-144964 | 6/1990 | Japan | 437/52 |
| 2-312271 | 12/1990 | Japan | 437/52 |

Primary Examiner—George Fourson
Assistant Examiner—Richard A. Booth
Attorney, Agent, or Firm—Ira S. Matsil; James C. Kesterson; Richard L. Donaldson

[57] ABSTRACT

A semiconductor 110 device includes an array of like base cells wherein each base cell includes at least one source 132 and at least one drain 130 region formed in a semiconductor substrate. At least one gate 126 is formed over and insulated from a channel region 118 which separates the source 132 and drain 130 regions. An insulating layer 190 overlies the structure. A plurality of contacts are formed in the insulating layer in a plurality of substantially parallel, evenly spaced grid lines G1–G5. In addition, at least one additional contact 150 formed between two adjacent ones G2 and G3 of the substantially parallel grid lines is formed. A plurality of interconnect lines 142 and 144 are formed over the insulating layer such that each contact is connected to at least one of the interconnect lines. Modifications, variations, circuit configurations and an illustrative fabrication method are also disclosed.

12 Claims, 7 Drawing Sheets

PRIOR ART

METHOD FOR FORMING A GATE ARRAY BASE CELL

This application is a continuation of application Ser. No. 07/682,803, filed Apr. 8, 1991, now abandoned.

FIELD OF THE INVENTION

This invention generally relates to semiconductor devices and their fabrication and specifically to an improved gate array base cell structure and method for forming the same.

BACKGROUND OF THE INVENTION

In the fabrication of integrated circuits it is often necessary to form a large number of transistors on a single chip. These transistors are interconnected to form logic gates, flip-flops, memory cells and a wide variety of other devices. A gate array is an array of transistor circuits which utilize the same base cell for many different applications. In this configuration, only the final interconnection levels of the multilevel device are specifically designed for any given application. The initial levels, known as the base cell, are the same for each implementation.

One type of gate array includes moat regions which comprise p-doped silicon and other moat regions which comprise n-doped silicon. These regions can be used to create p-channel and n-channel devices, respectively. One example of an application which uses both conductivity type channels is a CMOS (complementary metal oxide semiconductor) device.

Many gate array applications require the gates of adjacent base cells to be connected electrically. This electrical connection is often made when the gates are formed during the base cell fabrication. Connected gates are common in CMOS devices, for example.

The portions of the cell, including the gate and the moat regions, are connected into the final transistor configurations by routing conductive lines over the cells of the array which covered by an insulating layer. Contacts are formed in the insulating layers and thereby the desired circuits are formed. Multiple layers of metal lines and insulating layers may be used.

The metal interconnect lines are placed in a grid-like fashion over the base cell. Each line is substantially parallel or perpendicular to and evenly spaced from adjacent lines on the grid pattern. To avoid two separate lines crossing, the interconnects must be routed around each other or another interconnect level must be formed. This creates an added cost in either area or in the number of levels.

Accordingly, improvements which overcome any or all of the problems are presently desirable.

SUMMARY OF THE INVENTION

Other objects and advantages will be obvious, and will in part appear hereinafter and will be accomplished by the present invention which provides a gate array base cell which an improved gate layout for more efficient area usage.

A semiconductor device includes at least one source and at least one drain region formed in a semiconductor substrate. At least one gate is formed over and insulated from a channel region which separates the source and drain regions. An insulating layer overlies the structure. A plurality of contacts are formed in the insulating layer. The contacts are formed in a plurality of substantially parallel, evenly spaced grid lines. In addition, at least one additional contact formed between two adjacent ones of the substantially parallel grid lines is formed. A plurality of interconnect lines are formed over the insulating layer such that each contact is connected to at least one of the interconnect lines.

More specifically, a gate array base cell comprises two moat regions which may be the same or different conductivity types. The moat regions are separated by an insulating region which may be silicon dioxide, for example. First and second channel regions formed in the first moat region and third and fourth channel regions are formed in the second moat region. A first gate insulatively overlies the first and third channel regions and includes a portion which extends towards a second gate. Likewise the second gate insulatively overlies the second and fourth channel regions and includes a portion which extends towards the first gate. A plurality of interconnects are formed which create the desired transistor circuits. In general, the invention provides a transistor structure wherein interconnect connects are formed in positions not on the grid pattern.

An advantage of the invention is that it provides a substantial area savings without requiring an additional interconnect level. The interconnect layout is much more flexible over prior art structures. This advantage is maintained without any additional fabrication costs.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific way to make and use the invention, and do not delimit the scope of the invention.

The following is a description of the present invention. The prior art will be briefly described. The invention will then be described with reference to one exemplary illustration. Several variations will then be described along with some examples of usage. Finally, one sample method of fabrication will be described.

Figure 1:
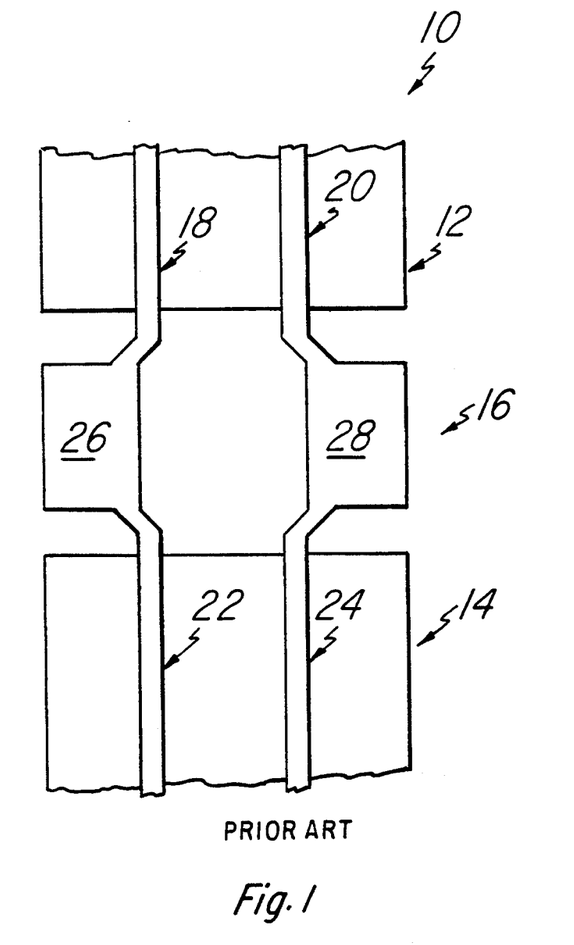
FIG. 1 shows a prior art base cell.

Referring first to FIG. 1, a prior art base cell structure 10 is shown. The base cell comprises a moat region 12 and a moat region 14 which are separated by an insulating region 16. The moat region 12 includes two channel regions 18 and 20. Likewise, the moat region 14 includes two channel regions 22 and 24. Overlying the channel regions are gates 26 and 28. As shown in the figure, gate 26 overlies channel regions 18 and 22 and gate 28 overlies channel regions 20 and 24. The structure, may be a CMOS base cell, as is known in the art.

Figure 2A:
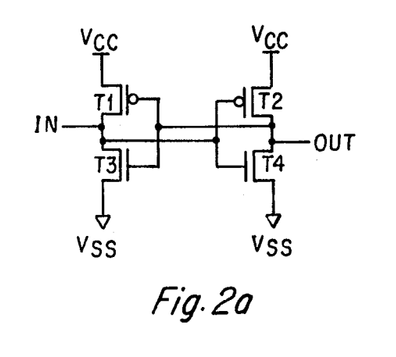
FIG. 2a–2c shows the schematic and layout for a prior art flip-flop cell.
Figure 2B:
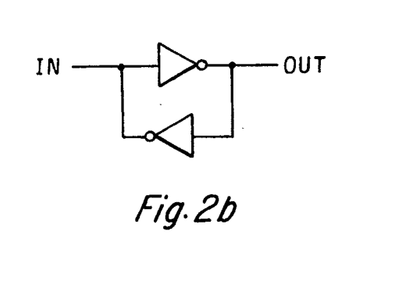
Figure 2C:
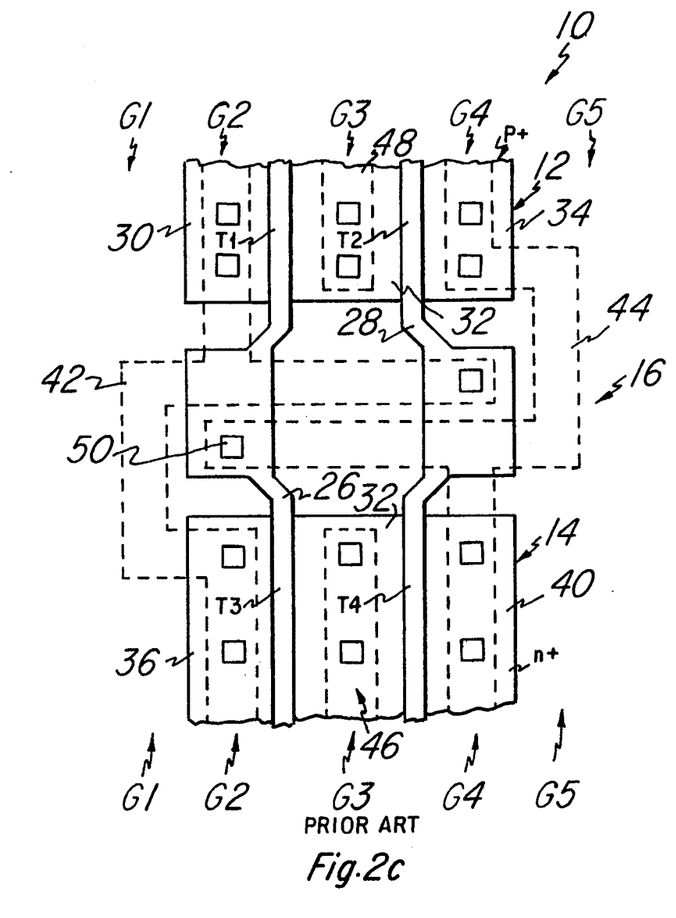

FIG. 2 illustrates an example of using the prior art base cell structure of FIG. 1 to form a flip-flop. The schematic diagram of the flip-flop is shown in FIG. 2a and the functional diagram in FIG. 2b. The layout of the flip-flop is shown in FIG. 2c.

Referring now to FIG. 2c, interconnect line 42 connects moat region 36, moat region 30, and gate 28. Similarly, interconnect line 44 connects moat region 34, moat region 40, and gate 26. Also shown are interconnect line 48 which connects moat region 32 to voltage source Vcc (not shown) and interconnect line 46 which connects region 38 to voltage source Vss (not shown). The conductive interconnects are formed over an insulating layer which covers the entire base cell and contacts are formed through holes formed in the insulating layer. Interconnect technology is well known in the art.

The contacts are frowned along grid lines, which are labeled as G1 through G5. The width of the grid lines is determined by the process technology being used. In the example shown, interconnect line 42 travels from grid line G2 to grid line G1 and back to grid line G2 so that it may traverse interconnect line 44 (at contact 50 with gate 26). Similarly, interconnect line 44 travels in both grid line G4 and G5. In this example, the cell is four grid lines wide but highly inefficient since adjacent cells may not be used for the same cell configuration. Therefore, only every other cell may be used. Clearly, a more efficient base cell configuration is desired.

Figure 3:
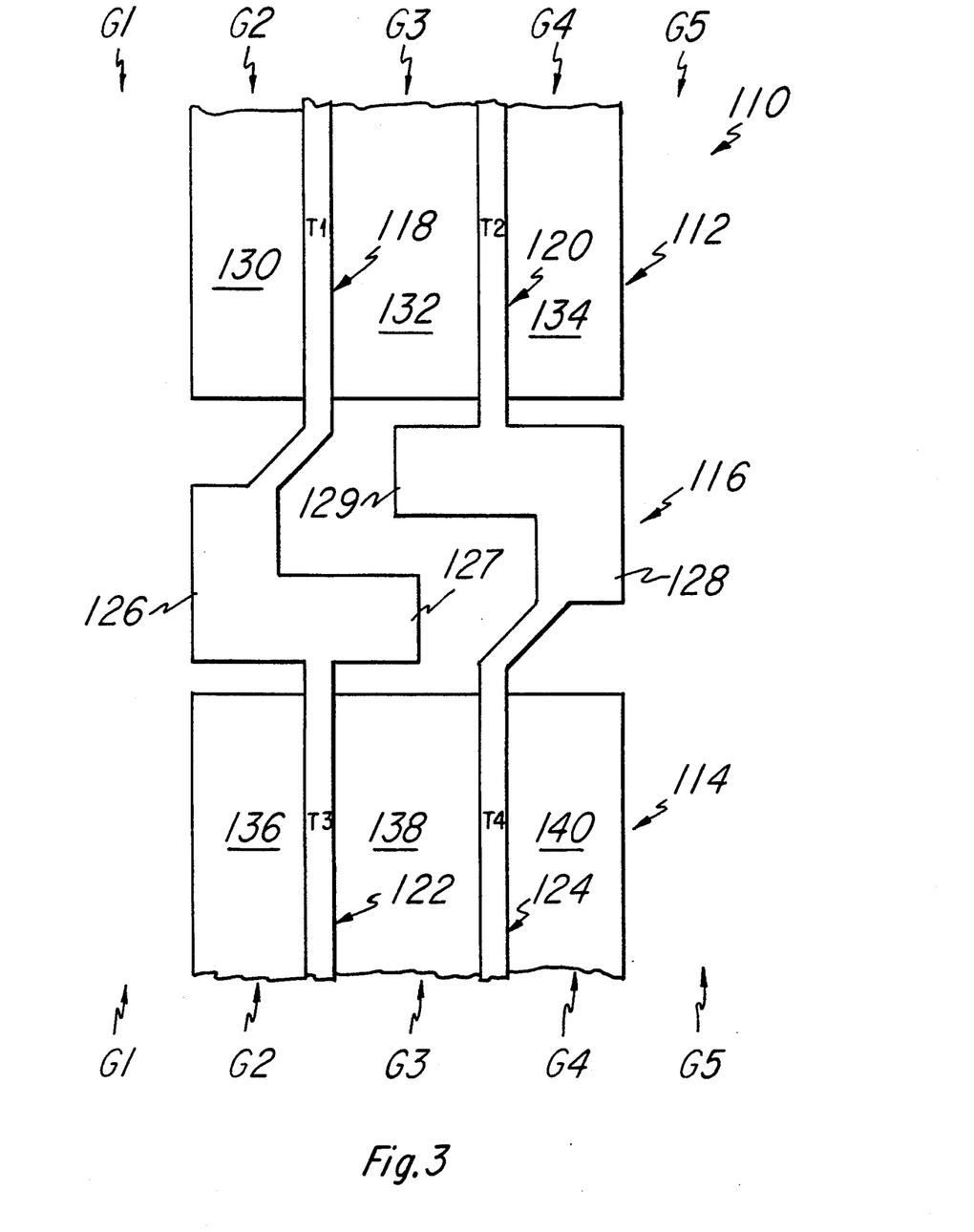
FIG. 3 shows a preferred embodiment base cell.

Referring now to FIG. 3a preferred embodiment base cell structure 110 is shown. The base cell comprises a moat region 112 and a moat region 114 which are separated by an insulating region 116. The moat regions typically comprise heavily doped silicon. As an example, in a CMOS (complementary metal oxide semiconductor) device the moat region 112 comprises p+ doped silicon and the moat region 114 comprises n+ doped silicon, or vice versa. The regions 112 and 114 may also be doped to the same conductivity type to form n-channel or p-channel devices, for example. The insulating region 116 may comprise an oxide such as silicon dioxide, for example. The base cell 110 is typically one cell in an array of many like cells.

In the cell illustrated in FIG. 3, the moat region 112 includes two channel regions 118 and 120. Likewise, the moat region 114 includes two channel regions 122 and 124. The channel regions typically, but not necessarily, comprise silicon doped to the opposite conductivity as the remainder of the respective moat region.

Overlying the channel regions are gates 126 and 128. As shown in the figure, gate 126 overlies channel regions 118 and 122 and gate 128 overlies channel regions 120 and 124. The gates are separated from the underlying channel by an insulating layer, not shown. The insulating layer may comprise an oxide, a nitride or both, as examples. The gates may typically be formed from doped polysilicon.

The channel region 118 is the channel for transistor T1 which also includes source region 130, drain region 132, and gate 126. Likewise, channel region 120 is the channel for transistor T2 which also includes source region 134, drain region 132, and gate 128. A like situation is found in moat region 114 where transistor T3 includes source region 136, drain region 138, channel region 122 and gate 126 and transistor T4 includes source region 138, drain region 140, channel region 124 and gate 128. Of course, the source and drain may be reversed as required by the application.

An insulating layer (not shown) is formed over the entire base cell 110 as well as the other base cells in the array. Contact holes (not shown) are formed in the insulating layer and interconnects (not shown) are formed to connect the transistors to form the desired circuits. Unlike the prior art and as a unique feature of the present invention, the contacts may or may not follow along a grid line.

Gate 126 includes a portion 127 which extends towards gate 128. Likewise, gate 128 includes a portion 129 which extends towards gate 126. The gate extension portions 127 and 129 provide an off grid position to place contacts for overlying interconnect lines, not shown. The additional flexibility of being to place contacts in off grid positions is an advantage over prior art techniques.

The structure shown in FIG. 3 is just one of many possible configurations which utilize gate structures which allow for off grid contacts. The inventive concept may be applied to any number of transistor structures.

Figure 4A:
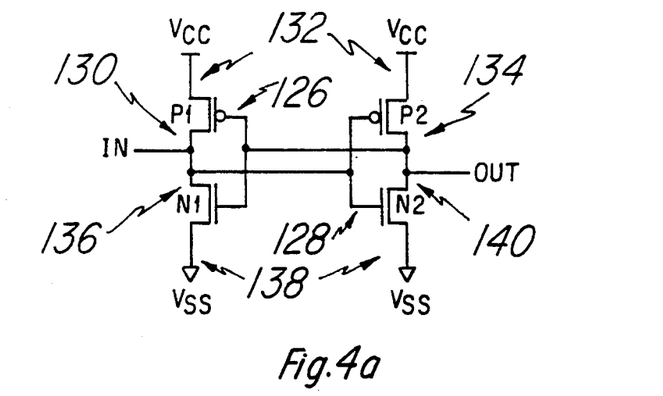
FIG. 4a–4c shows the schematic and layout for a flip-flop cell embodiment.
Figure 4B:
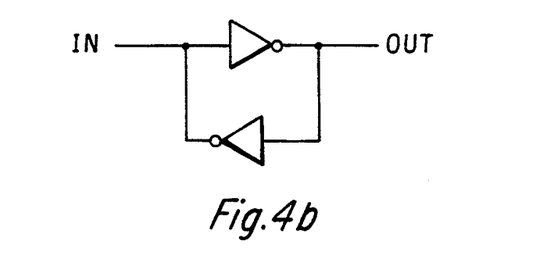
Figure 4C:
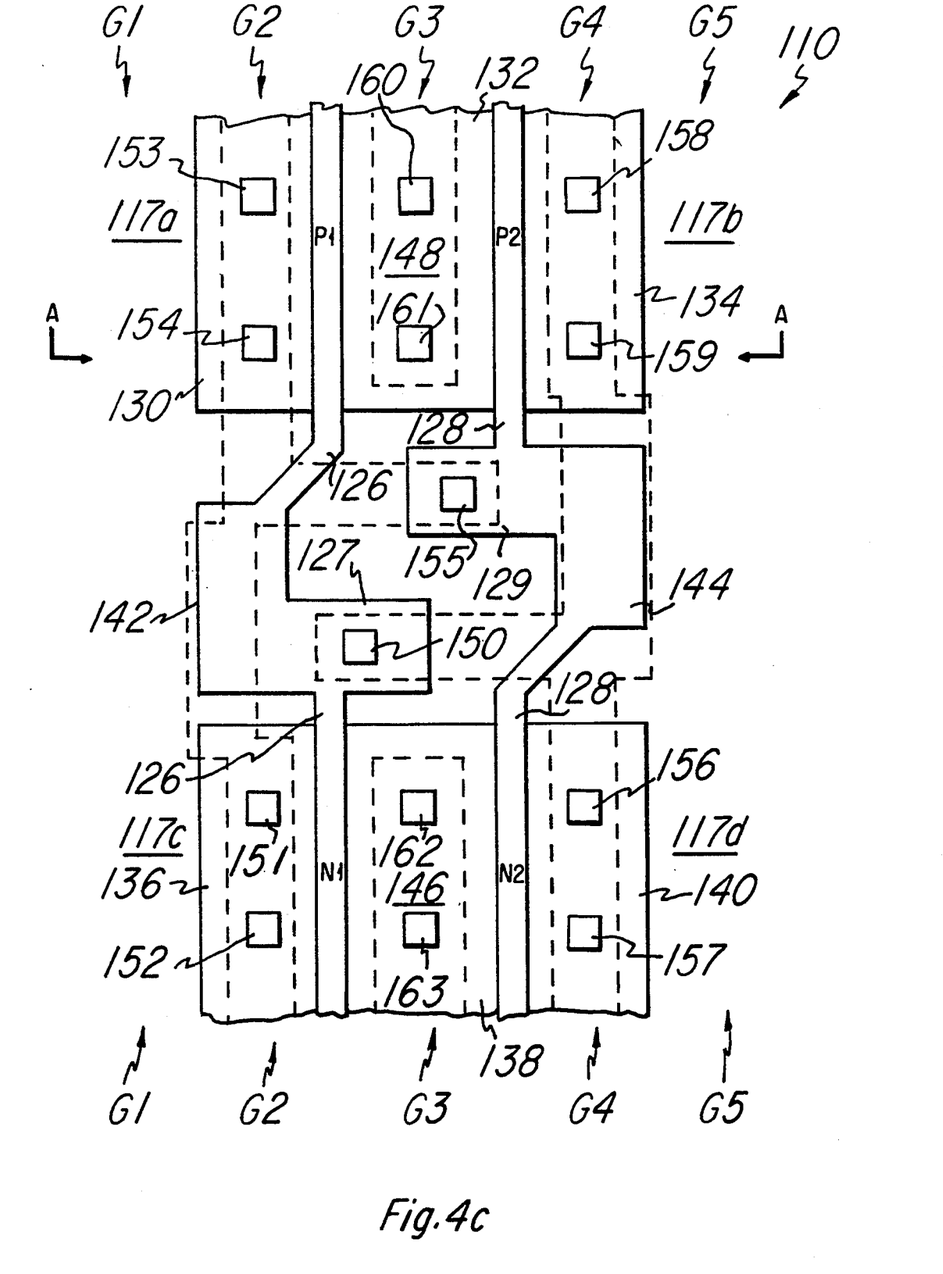

A specific embodiment of a transistor configuration is shown in FIG. 4 where FIG. 4a illustrates a schematic diagram, FIG. 4b illustrates a functional diagram and FIG. 4c illustrates a layout of a CMOS flip flop memory device. The flip flop of FIG. 4 is functionally equivalent to the prior art flip flop of FIG. 2. The layout of FIG. 4 is, however, desirable because it requires only 60% of the surface area as the functionally equivalent prior art layout. FIG. 4 is illustrative of a circuit which incorporates the inventive concepts of the present invention.

The structure 110 shown in FIG. 4 is one cell in an array of many like cells. The cells are isolated from one another by insulation region 117 which may be an oxide, such as silicon dioxide for example. The array may include as many as 300,000 or 500,000 cells or more.

Referring now to FIG. 4c along with FIG. 4a, the source region 132 of p-channel transistors P1 and P2 is connected to interconnect line 148 through contacts 160 and 161 which lie along grid line G3. Interconnect line 148 is also connected to voltage source Vcc, which may be five volts, for example. Likewise, the source region 138 of n-channel transistors N1 and N2 is connected to interconnect line 146 through contacts 162 and 163. Contacts 162 and 163 also lie along grid line G3. Interconnect line 146 is also connected to voltage source Vss, which may be ground for example. Two contacts are illustrated on each of the source regions although one contact or more than two contacts may also be used.

Interconnect line 142 is coupled to drain region 136 through contacts 151 and 152 and is also coupled to drain region 130 through contacts 153 and 154 as well as gate 128 through contact 155. Contact 155 is formed on the gate extension portion 129 of gate 128 and falls on an off grid position. Analogously, interconnect line 144 is coupled to drain region 140 through contacts 156 and 157 and is also coupled to drain region 134 through contacts 158 and 159 as well as gate 126 through contact 150. Contact 150 is formed on the gate extension portion 127 of gate 126 and falls on an off grid position.

Because contact 150 is formed on gate extension portion 127, the interconnect line 142 may be routed between grid line G1 and grid line G2. As a result, grid line G1 may be utilized for an adjacent cell, which may be structurally equivalent to cell 110. Therefore a full line is saved and as a result every cell in the array can utilize this cell configuration. This difference over previous gate array structures provides a great advantage over the prior art which may utilize only every other cell in the functionally equivalent configuration. The equivalent is true with interconnect line 144 which does not span into grid line G5. As a result, the layout of FIG. 4c requires only three grid lines wherein the prior art layout of FIG. 2c requires five grid lines.

Although illustrated for a flip-flop memory cell, the gate layout may also be utilized for other logic gates, such as inverters and NAND as examples, or other logic devices such as random access memories, read only memories or multiport memories.

The base cell structure may have one or more gates per moat region. In addition a structure which provides more than one possible transistor per gate, such as the one gate cell described in co-pending patent application Ser. No. 681,822 now U.S. Pat. No. 5,217,915, may be used.

The following description is illustrative of one possible method to form the structure of the present invention. The fabrication method will be described with reference to the cross-sectional drawings of FIG. 5.

Figure 5A:
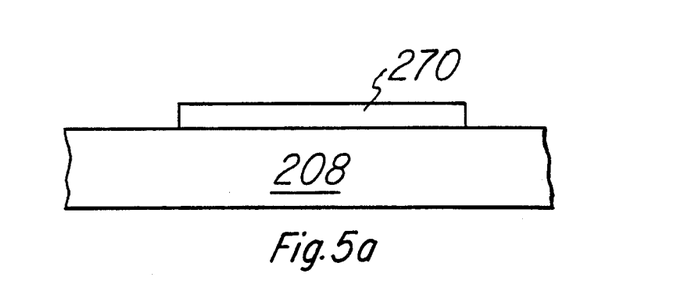
FIG. 5a–5e are cross-sectional views illustrative of one method of fabrication.

Referring to FIG. 5a, a semiconductor substrate 208 is provided. In a preferred embodiment, the substrate 208 comprises lightly doped p-type silicon. The substrate 208 may also be lightly doped n-type silicon, for example. In the first step of the fabrication processed to be described, a masking layer 270, such as nitride for example, is deposited and etched to cover the active areas.

Figure 5B:
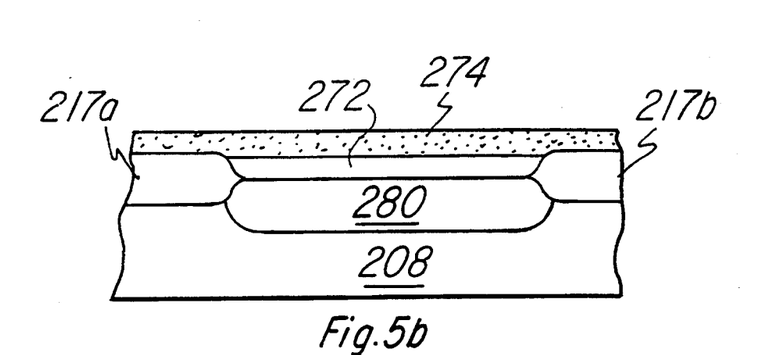

Referring now to FIG. 5b, an insulating region 217 is formed on the substrate surface where the masking layer 270 is not present. One method which may be used is to thermally grow an oxide layer and form a silicon dioxide isolation region 217. After forming the isolation region 217, the masking layer 270 is removed.

If a p-doped substrate 205 is used and a p-channel device is required, then the next step of the illustrative process is to form n-well 280. The n-well 280 is formed using well known doping techniques such as implantation or diffusion, as examples. If a CMOS gate array, such as the one shown in FIG. 4, is being formed, then some of the devices will be n-channel and the remaining devices p-channel. The figures illustrate a p-channel MOS fabrication step but it should be understood the CMOS fabrication can easily be accomplished with the inclusion of cells which do not include n-well as described above. Of course, if only n-channel devices are required in the array, no n-wells will be included.

Gate insulating layer 272 is formed in the active areas. The insulating layers typically comprise an oxide, for example. This oxide may be deposited, for example. Conducting layer 274 is then formed over the gate insulating layer 272. Conducting layer 274 typically comprises highly doped polysilicon, for example.

Figure 5C:
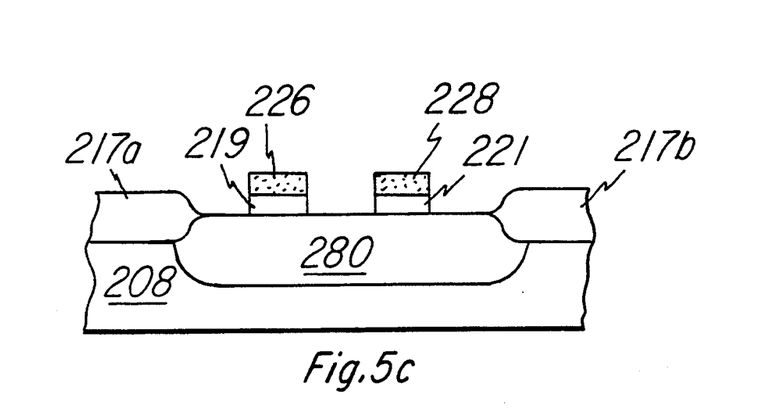

Referring next to FIG. 5c, conductive gate layer 274 and gate insulating layer 272 are patterned and etched to form gate 226 and gate 228 as well as gate insulating layer 219 and 221. Of course, the gate extension portions, not shown, are also created during this step. The gates are created using well known process steps to create the gate design of choice as described with reference to FIGS. 3 and 4.

Figure 5D:
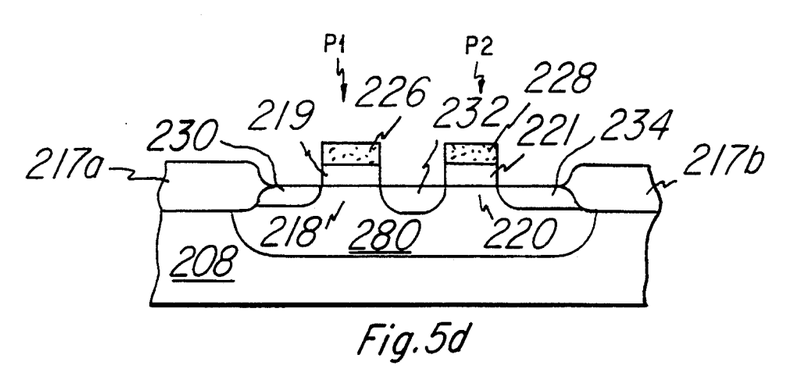

The moat regions 230, 232, and 234 are then doped as illustrated in FIG. 5d. The doping process can be performed by ion implantation or by one of the other well known doping techniques such as diffusion, for example. An annealing step is often performed after doping the moat region. The conductivity type of the dopant in the moat region determines the conductivity of the device, i.e., n-channel or p-channel. As discussed previously, the doping type of the channel 218 and 220 is typically, but not necessarily, different than that of the moat regions 230, 232, and 234.

The cross-sectional view shown in FIG. 5d is a view of the structure illustrated in FIG. 4c along the AA line. As illustrated, channel region 218 along with source region 230 and drain region 232 and gate 226 form transistor P1 and likewise channel region 220 along with source region 234 and drain region 232 and gate 228 form transistor P2. An analogous process flow is used to form the other embodiments described herein.

The next step of the illustrative process flow is the deposition of insulating layer 290 over the entire surface of the base cell 210 and the other base cells on the chip. Insulating layer 290 may be formed from a deposited oxide or nitride, for example. Since the base cell pattern is the same for many different application, the cells may be fabricated prior to the design or production of the actual circuit. Insulating layer 290 will protect the device during storage periods if the device is in fact prefabricated.

Figure 5E:
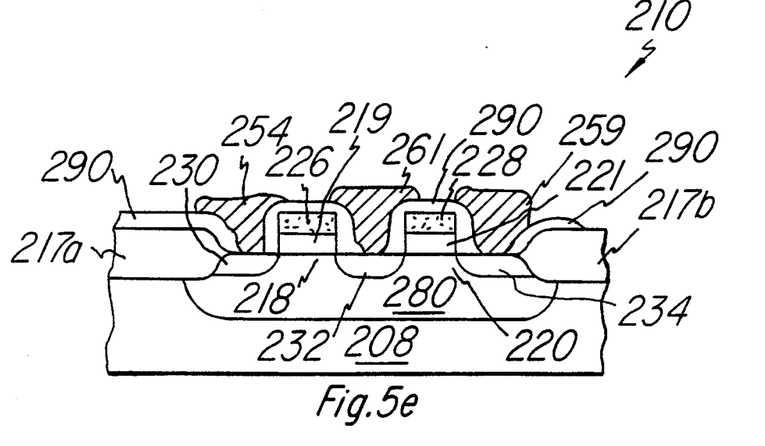

To form the connections required for the desired circuit, a hole is formed in insulating layer 290 and a contact is formed. FIG. 5e illustrates contact 254, contact 261 and contact 259 as examples. One method to form the contact is by etching layer 290 and creating a metallic plug 255 (or 261 or 259), as is well known in the art. The metallic plug 255 (or 261 or 259) may comprise tungsten for example.

Interconnect lines, not shown, are then formed and etched to create the desired connections as previously discussed. The interconnect lines may be formed from a metal such as tungsten or titanium or aluminum. Although not shown, as is well known in the art, a multi-level interconnect scheme may be implemented by forming an additional insulating layer and forming additional interconnect lines.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an array of base cells in a semiconductor region, the method of forming each cell comprising the steps of:

forming an n-doped region in said semiconductor region;

forming a p-doped region in said semiconductor region, said p-doped region spaced from said n-doped region by an insulating region;

doping said n-doped region with p-type dopants to form first, second, and third p-doped source/drain regions, said first and second p-doped source/drain regions separated by a first n-doped channel, and said second and third p-doped source/drain regions separated by a second n-doped channel;

doping said p-doped region with n-type dopants to form first, second, and third n-doped source/drain regions, said first and second n-doped source/drain regions separated by a first p-doped channel, and said second and third n-doped source/drain regions separated by a second p-doped channel;

said doping steps performed such that said first n-doped and first p-doped source/drain regions are formed centered along a first grid line, said second n-doped and second p-doped source/drain regions are formed centered along a second grid line, and said third n-doped and third p-doped source/drain regions are formed centered along a third grid line and wherein said first, second and third grid lines are non-collinear;

forming an insulating layer over each of said channel regions;

forming a first conductive gate over said first n-doped channel, said insulating region and said first p-doped channel, wherein the portion of said first gate formed on said insulating region crosses said first and second grid lines; and forming a second conductive gate over said second n-doped channel, said insulating region and said second p-doped channel, wherein the portion of said second gate formed on said insulating region crosses said second and third grid lines.

2. The method of claim 1 and further comprising the step of forming a plurality of interconnects over said base cell for electrically coupling to said source/drain regions and said gates to form a transistor circuit.

3. A method of forming a static memory cell comprising the steps of:
forming an n-doped region in a semiconductor region;
forming a p-doped region in said semiconductor region, said p-doped region spaced from n-doped region by an insulating region;
doping said n-doped region with p-type dopants to form first, second, and third p-doped source/drain regions, said first and second p-doped source/drain regions separated by a first n-doped channel, and said second and third p-doped source/drain regions separated by a second n-doped channel;
doping said p-doped region with n-type dopants to form first, second, and third n-doped source/drain regions, said first and second n-doped source/drain regions separated by a first p-doped channel, and said second and third n-doped source/drain regions separated by a second p-doped channel;
said doping steps performed such that said first n-doped and first p-doped source/drain regions are formed centered along a first grid line, said second n-doped and second p-doped source/drain regions are formed centered along a second grid line, and said third n-doped and third p-doped source/drain regions are formed centered along a third grid line wherein said first, second, and third grid lines are non-collinear;

forming an insulating layer over each of said channel regions;

forming a first conductive gate over said first n-doped channel, said insulating region and said first p-doped channel, wherein the portion of said first gate formed on said insulating region crosses said first and second grid lines;

forming a second conductive gate over said second n-doped channel, said insulating region and said second p-doped channel, wherein the portion of said second gate formed on said insulating region crosses said second and third grid lines;

forming a first interconnect electrically coupled to said first n-doped source/drain region, said second conductive gate and said first p-doped source/drain region;

forming a second interconnect electrically coupled to said third n-doped source/drain region, said second conductive gate and said third p-doped source/drain region.

4. The method of claim 3 wherein said first interconnect is formed along said first grid line and includes a portion extending across said second grid line to couple to said first gate.

5. The method of claim 4 wherein said second interconnect is formed along said third grid line and includes a portion extending across said second grid line to couple to said second gate.

6. The method of claim 1 wherein said step of forming an insulating layer comprises the step of growing an oxide.

7. The method of claim 1 wherein said step of doping said p-doped region comprises implanting n-type impurities.

8. The method of claim 1 wherein said step of doping said n-doped region comprises implanting p-type impurities.

9. The method of claim 2 wherein said transistor circuit includes an inverter.

10. The method of claim 2 wherein said transistor circuit includes a flip-flop.

11. The method of claim 2 wherein said interconnects comprise metal interconnects.

12. The method of claim 2 wherein said step of forming conductive gates comprises the step of forming polysilicon gates.

* * * * *